United States Patent
Yun et al.

(10) Patent No.: US 10,857,738 B2
(45) Date of Patent: Dec. 8, 2020

(54) SYSTEMS AND METHODS FOR REAL-TIME DEFECT DETECTION, AND AUTOMATIC CORRECTION IN ADDITIVE MANUFACTURING ENVIRONMENT

(71) Applicant: Tytus3D Systems Inc., Fremont, CA (US)

(72) Inventors: Jerald Yun, Pleasanton, CA (US); Hon S. Yi, San Jose, CA (US); Ilgoo Hwang, San Jose, CA (US)

(73) Assignee: Tytus3D System Inc., Fremont, CA (US)

( * ) Notice: Subject to any disclaimer, the term of this patent is extended or adjusted under 35 U.S.C. 154(b) by 0 days.

(21) Appl. No.: 16/356,897

(22) Filed: Mar. 18, 2019

(65) Prior Publication Data

US 2019/0283333 A1     Sep. 19, 2019

Related U.S. Application Data

(60) Provisional application No. 62/644,685, filed on Mar. 19, 2018.

(51) Int. Cl.
| | |
|---|---|
| *B29C 64/393* | (2017.01) |
| *B22F 3/105* | (2006.01) |
| *G05B 17/02* | (2006.01) |
| *G06N 3/08* | (2006.01) |
| *B29C 64/153* | (2017.01) |

(Continued)

(52) U.S. Cl.
CPC .......... *B29C 64/393* (2017.08); *B22F 3/1055* (2013.01); *B29C 64/153* (2017.08); *B33Y 30/00* (2014.12); *G05B 17/02* (2013.01); *G06F 30/00* (2020.01); *G06N 3/08* (2013.01);
(Continued)

(58) Field of Classification Search
CPC ... B29C 64/393; B29C 64/153; B22F 3/1055; B22F 2003/1057; B33Y 50/02; B33Y 10/00; B33Y 30/00; G06N 3/0445; G06N 3/0454; G06N 3/08; G06N 20/00; G06F 11/3058; G06F 11/0751; G06F 11/0736; G06F 11/3013; G06F 11/00; G06F 30/00; G05B 2223/02; G05B 13/048;
(Continued)

(56) References Cited

U.S. PATENT DOCUMENTS

| | | |
|---|---|---|
| 2009/0206065 A1 | 8/2009 | Kruth et al. |
| 2016/0184893 A1 | 6/2016 | Dave et al. |

(Continued)

*Primary Examiner* — Jigneshkumar C Patel
(74) *Attorney, Agent, or Firm* — Jimin Jeong

(57) ABSTRACT

Systems and methods of monitoring solidification quality and automatic correcting any detected defect in additive manufacturing are described. The present disclosure includes a build station for manufacturing one or more parts and a controller having one or more computer-vision based system coupled to the build station. One or more camera is provided to obtain a plurality of images of the solidified parts at predetermined settings. The present disclosure introduces a predictive model trained by machine learning algorithm, the predictive model calculates level of solidification quality of a manufactured part and build parameters value to be adjusted. The present disclosure introduces a plurality of validation coupons having various shapes to enhance more accuracy in manufacturing, wherein the validation coupons further include block data which is distributed to electronic ledger system.

18 Claims, 15 Drawing Sheets

(51) Int. Cl.
  *G06N 20/00* (2019.01)
  *B33Y 30/00* (2015.01)
  *G06F 30/00* (2020.01)
  *B33Y 50/02* (2015.01)
  *B33Y 10/00* (2015.01)

(52) U.S. Cl.
  CPC ...... *G06N 20/00* (2019.01); *B22F 2003/1057* (2013.01); *B33Y 10/00* (2014.12); *B33Y 50/02* (2014.12)

(58) Field of Classification Search
  CPC ........... G05B 17/02; G01N 2021/8411; G01N 21/8806; G01N 2021/8883; G01N 21/8851
  USPC .......................................................... 700/65
  See application file for complete search history.

(56) References Cited

U.S. PATENT DOCUMENTS

| | | | |
|---|---|---|---|
| 2016/0193696 A1* | 7/2016 | Mcfarland | B22F 3/008 219/76.12 |
| 2016/0236414 A1* | 8/2016 | Reese | G05B 19/41875 |
| 2017/0001379 A1* | 1/2017 | Long | B23K 15/0013 |
| 2018/0341248 A1* | 11/2018 | Mehr | G05B 19/4099 |

* cited by examiner

SYSTEMS AND METHODS FOR REAL-TIME DEFECT DETECTION, AND AUTOMATIC CORRECTION IN ADDITIVE MANUFACTURING ENVIRONMENT

CROSS-REFERENCE TO A RELATED APPLICATION

This application is a nonprovisional of claims the benefit of and priority to U.S. Provisional Patent Application No. 62/644,685, filed Mar. 19, 2018, inventors Ilgoo Hwang et al., titled "Quality Assurance Systems and Methods in Additive Manufacturing Process", which is commonly assigned herewith, and all of which is hereby incorporated herein by reference in its entirety with the same full force and effect as if set forth in its entirety herein.

FIELD OF THE INVENTION

The present disclosure generally relates to systems and methods of monitoring additive manufacturing process via computer vision based system and, more particularly, to perform automated corrective actions in real-time using artificial intelligence.

BACKGROUND OF THE INVENTION

Additive manufacturing, as known as three-dimensional printing, is a technology that produces three-dimensional parts layer by layer from a powdered material which may be polymer or metal based. Most of the powder-bed based additive manufacturing system uses a powder deposition method having a coating mechanism to apply a powder layer onto a build plate and powder bed. Once the powder layer is applied, a two-dimensional slice is either bound together, known as three-dimensional printing, or melted using one or more laser sources to the powder bed.

The Powder-Bed-Fusion (PBF) technology widely is being adopted in the additive manufacturing industry. In PBF technology, raw material should be distributed uniformly and to spread evenly in layer-by-layer process to ensure density of built part as designed, and even when melted, it must have a uniform density to ensure quality without defects such as cracks, deformation or delamination.

In conventional additive manufacturing, a physical or destructive analysis is performed to ensure the solidification quality of the fabricated part (e.g., cutting open, computerized tomography scan, x-ray, and optical analysis), and if any defect is found at this step, the fabricated part must be discarded. In case the part is manufactured over a several weeks and a defect is detected from the physical analysis, which means that the total time for manufacturing and resources (e.g., energy and powder materials) can be wasted. However, established processes for monitoring the additive manufacturing process are limited. A quality assurance monitoring system consists with various technologies such as melt-pool monitoring, thermal profiling, co-axial monitoring and numerical analysis, but the problem is that the system tends to make the manufacturing process slower as the monitoring system requires computing power to detect the defective and correct if necessary. Additionally, such defects may be occurred not only during the manufacturing, but also while the user is using the object by their negligence, so it is difficult to find out where the responsibility of the defects belongs to.

Consequently, there is a need for methods and systems for non-destructively monitoring the solidification quality of the manufactured part and automatically correcting for any detected defects in real-time during the process.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF REPRESENTATIVE EMBODIMENTS

Figure 1:
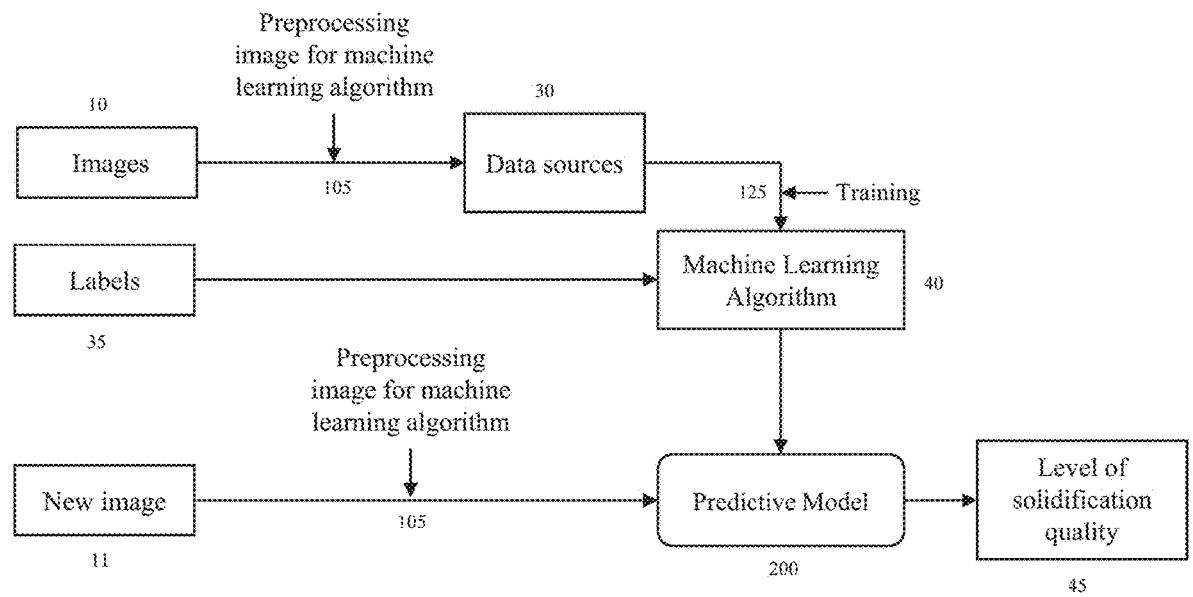
FIG. 1 is a block diagram of an embodiment illustrating a work frame for training data sources to generate a predictive model and to obtain an expected label via applying new image to the predictive model.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

In the disclosed embodiment, based on the characteristics shown in captured images at predetermined setting in sequence, a predictive model is generated, which determines and predicts an estimated parameter value to be adjusted to correct by identifying the solidification quality of the scanned layer powder. The captured image of scanned layer powder during additive manufacturing process may represent that well-melted metal surface has high-reflective characteristic, such as specular reflection, or unevenly melted (or less melted, or partially melted) metal surface has scattered reflective characteristic, such as diffuse reflection. The difference in contrast between the melted surface and the non-melted surface can also vary depending on the degree of melting (or solidification).

In the disclosed embodiment, a curve indicating contrast changes from captured images or characteristic changes from captured images can be generated based on captured images at predetermined setting in sequence, e.g., location of image recording device(s) and angular orientation, and/or location of light source(s) and directions, since the output image may vary under these settings. In some instances, a plurality of light sources may be installed on opposite sides of the build station to minimize scattering of reflected light on the glossy surface of the solidified part in a target area.

An exemplary embodiment may employ an off-axis imaging system for monitoring solidification quality during additive manufacturing environment, which is used to record the real-time laser scanning process. There are one or more of light sources and the captured image will reflect the brightness and several factors. The appearing contrasts in white and black images caused by difference of light reflectivity from the solidified surface. When the system uses metal powder material, the reflectivity might be influenced by illumination and detected angular orientation, and the surface roughness. The disclosed embodiment uses the characteristics of contrasts in white and black images result from difference of light reflectivity from the surface.

The melted and solidified region and the non-melted region on the entire powder layer are compared to selectively extract only the melted region, thereby reducing the size of data to be transmitted. In the next step, feature-set analyzed through the computer-vision based system, which can be processed through algorithm, such as CNN or ConvNet. Label each feature-set with the physically inspected solidification quality of the manufactured part and each build parameters corresponding to the layers, wherein the inspection of solidification quality may be conducted from using computerized tomography scan, x-ray, cutting open, and optical analysis. In some instances, the inspection results may be classified such as "good", "bad", or "premature", etc. That is to train machine learning algorithm, score each data-set such as "good" or "bad" for images having characteristic curve at specific build parameters, such as certain laser scanning velocity, or laser energy intensity, or powder material and so on.

Consequently, a new image (a data-set extracted by preprocessing, for example, a curve) is input to the trained predicted model during the actual manufacturing process to determine whether the solidification quality is normal or not, and automatically adjust build parameters in real-time to continue the build process, if necessary.

Figure 2:
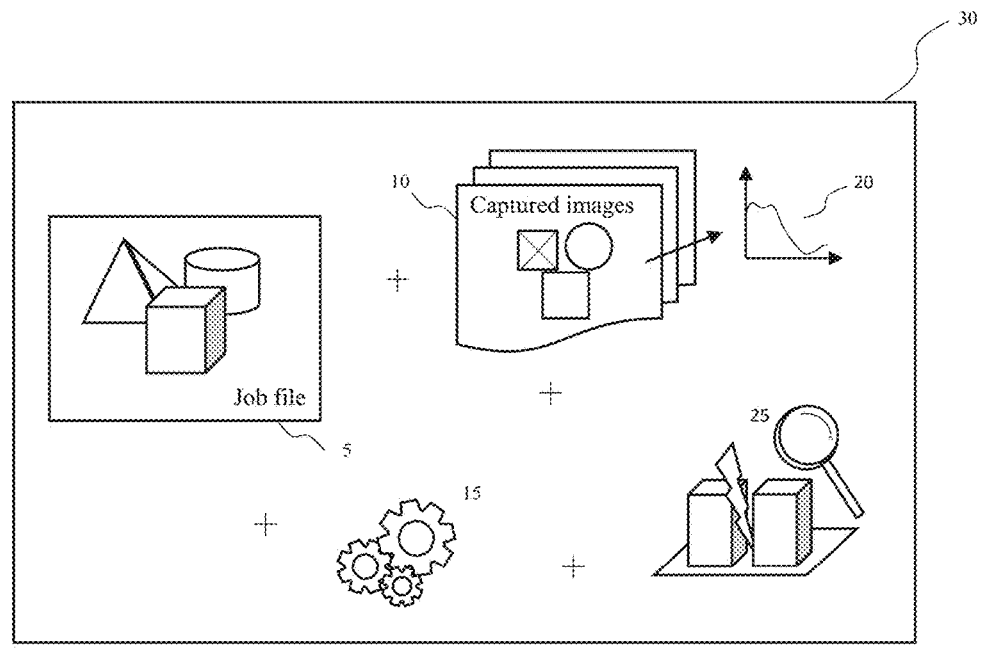
FIG. 2 is a block diagram of an embodiment illustrating for collecting data sources to be used in machine learning system.

FIG. 1 is a block diagram of an embodiment illustrating a framework for training 125 data-set to generate a predictive model 200 and to obtain an expected label 45 via applying at least one preprocessed new image to the predictive model, and FIG. 2 is a block diagram of an embodiment illustrating for collecting data sources to be used in machine learning system. In the present disclosed embodiment, a plurality of images 10, which captures output of each process of the present disclosed system, are stored to a coupled controller as data sources 100 in the form of preprocessed data which will be utilized for learning machine algorithm 105. In some instances, the data sources 30 are collected through various methods, as shown in FIG. 2, which can be obtained from a job file 5 having geometric information per each layers, a plurality of captured images 10, curves 20 reflecting contrast changes in sequence therefrom, data for solidification levels of corresponding layers obtained from inspection output (e.g., computerized tomography scan, cutting open, x-ray, or optical analysis) of manufactured part 25, and build parameters 15 for manufacturing. In disclosed embodiment, the curve 20 may include not only changes in contrast of the captured images, but also, other statistical inputs, such as, changes in manufactured dimension, changes in a laser energy level, changes in a scanning velocity, changes in a temperature of heater, changes in a gas flow rate, and so on.

The schema of exemplary embodiment takes labeled 35 data, e.g., curve, or preprocessed images, and feeds it into a particular machine learning algorithm 40 in order to generate a predictive model 200. With this generated predictive model 200, a user would then input unlabeled data 11, i.e., new image, and get labeled data 45, i.e., quality level of solidification, as output.

Figure 3:
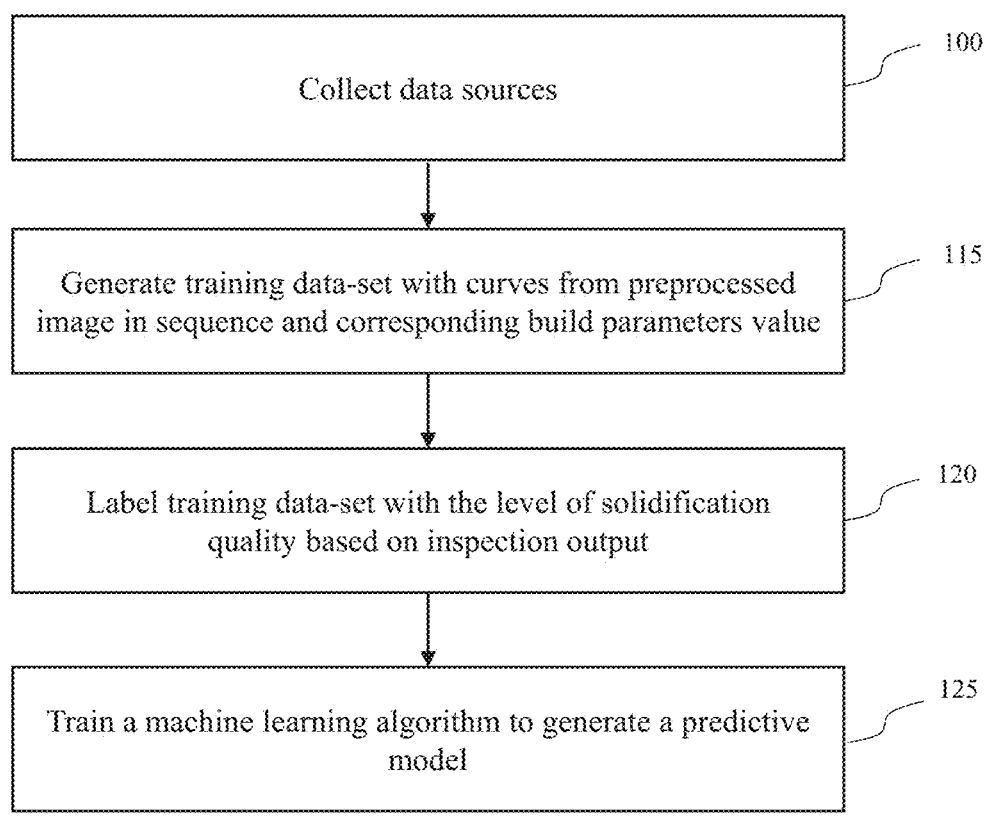
FIG. 3 is a flow chart illustrating steps of training data sources using machine learning algorithm and generating a predictive model therefrom according to an exemplary embodiment.

FIG. 3 is a flow chart illustrating a methods of training data sources using machine learning algorithm and generating a predictive model therefrom according to an exemplary embodiment. The method begins, step 100, as described above, with collecting data sources 30 obtaining from preprocessed captured images at predetermined setting in sequence layer by layer 105, job files 5, build parameters 15, inspection output of solidification quality level and corresponding layers thereof 25, step 115, generating training data-set with curves 20 from preprocessed image in sequence 10 and corresponding build parameter values 15, in some instances, preprocessed captured images in sequence may be input data in addition to the curves. In this present disclosed embodiment, the job file 5 is generated from a CAD/CAM file which includes two dimensionally sliced geometric information so that the machine is able to fabricate a part layer by layer. The solidification level based on inspection output is labeled with training data-set, step 120, and training a machine learning algorithm 40 to generate a predictive model 200, step 125. In another disclosed embodiment, inspection output 25 is obtained from physical analysis to score solidification quality for the manufactured part (e.g., "good", "bad", "premature", "overly heated" and so on), and consequently store the inspection output along with the build parameter-set 15 and preprocessed captured images 105, as data-set. For example, if any defect is found when physically analyzing the fabricated part, then find the saved captured image of the corresponding layer from the data sources, and update adjusted parameters to the corresponding preprocessed training data-set by adjusting build parameters (e.g., increase or decrease laser energy intensity), and label the updated build parameters and correlated image. Training session refers to find values that determine the predictive model, such as weight (i.e., strength of the connection) and bias. When presented with data (e.g., adjusted value of build parameters) during training, they are adjusted towards values that have correct output. Consequently, the user updates adjusted build parameters based on the level of solidification quality from inspection output, labels the data-set, and repeats updating it to train the machine learning algorithm.

In this present disclosure of an embodiment, machine learning algorithm may use deep learning algorithm (e.g., convolutional neural network (CNN), or a combination of CNNs and Long short-term memory (LSTMs)), in case of predicting unlabeled data-set. In some implementations, the deep learning algorithm may calculate build parameter values according to the extracted feature-set (or data-set) from new input, if adjustment is required. In another exemplary of embodiment, the implementations of CNNs may be performed on GPU optionally, when processing a plurality of heavy data.

Figure 4:
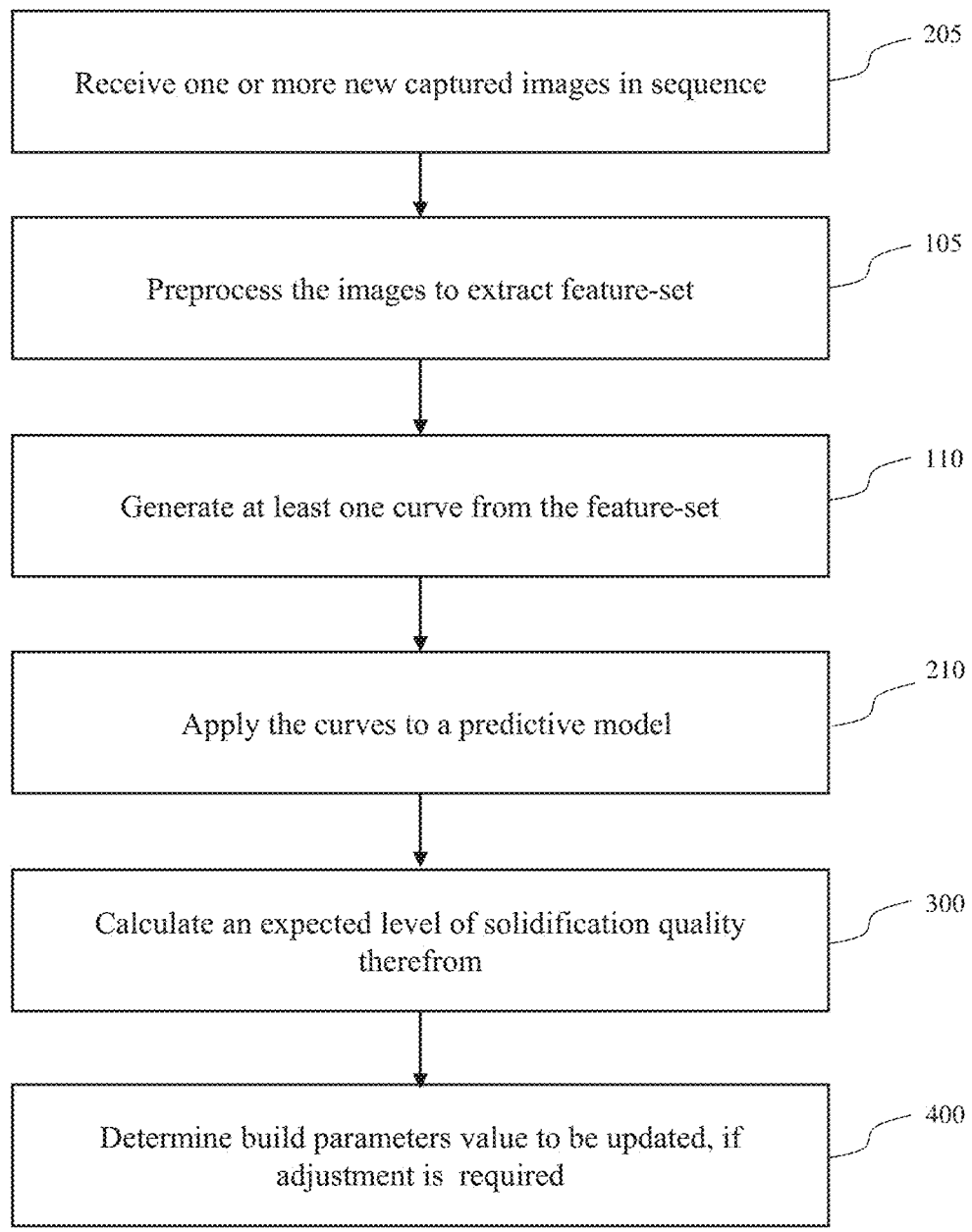
FIG. 4 is a flow chart illustrating steps of determining expected build parameters value via applying new image to a predictive model according to an exemplary embodiment.

FIG. 4 is a flow chart illustrating steps of determining expected build parameters value via applying new image to a predictive model 200 according to an exemplary embodiment. In the exemplary embodiment, the method begins, step 250, as described above, with receiving new captured images at predetermined setting in sequence. The images are preprocessed to extract data-set (i.e., feature vector) step 105, and then one or more curves are generated from the extracted data-set, step 110. The feature-set, as described above, also includes information such as build parameters. The curves would be applied to a predictive model, step 210, and an expected level of solidification quality would be calculated, step 300. As described above, the predictive model then calculates a build parameter value to update if determined to adjust, step 400. In some implementations, the predictive model may detect any overly melted or premature portion of the solidified part, which exceeds preset tolerance then based upon the trained predefined adjusted build parameter value. In the exemplary embodiment, these methods are implementing through coupled controller 800, such as computer.

Figure 5:
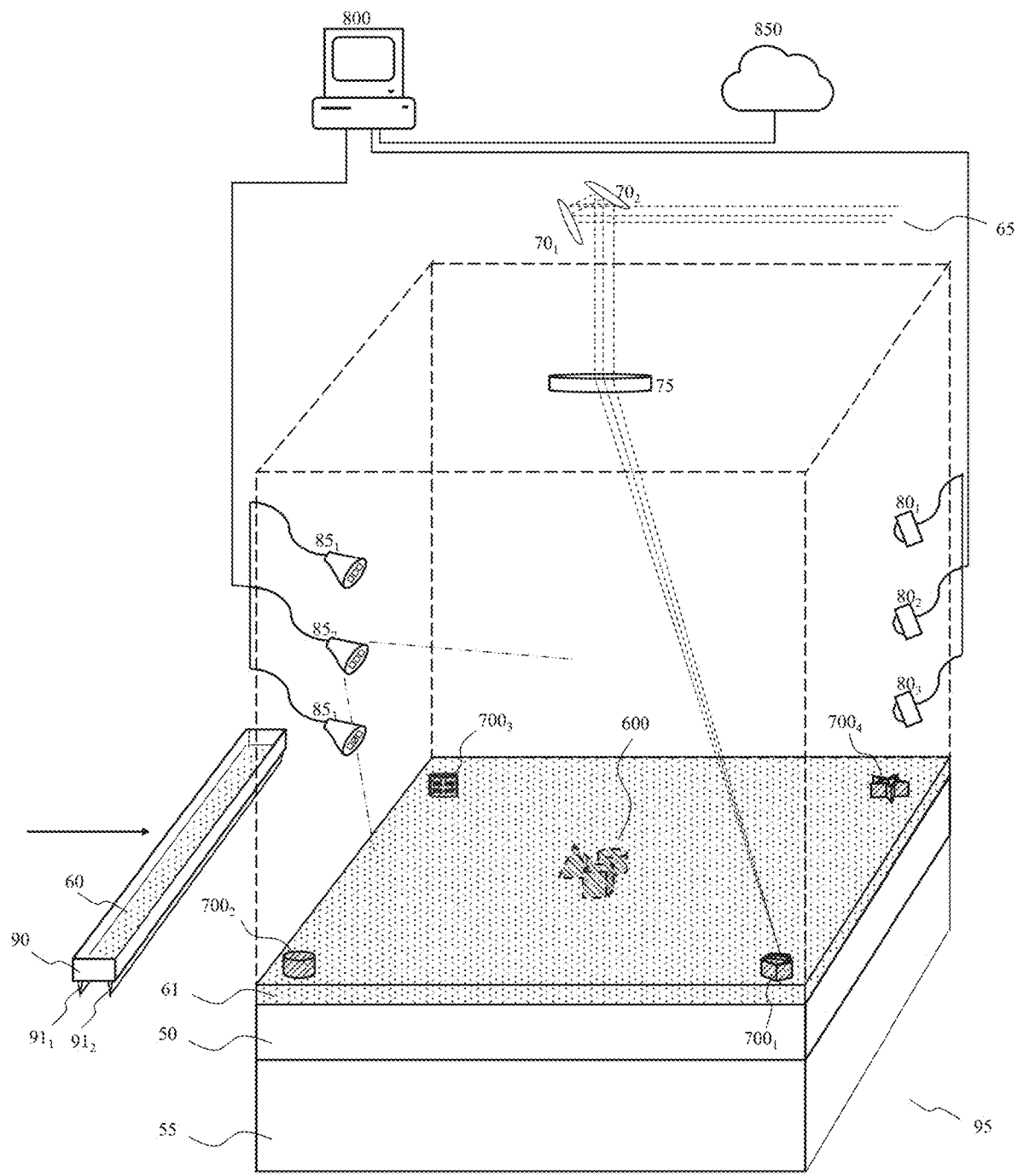
FIG. 5 is a schematic view of an embodiment illustrating a system for real-time defect detection and correction in additive manufacturing environment.

FIG. 5 is a schematic view of an embodiment illustrating a system for real-time error detection and correction in additive manufacturing environment. In the exemplary embodiment, the system 95 shown as Powder Bed Fusion (PBF) system. In some implementations, the described embodiment herein is described with reference to a PBF system, wherein the disclosure also applies to other types of additive manufacturing systems including, but not limited to, selective laser melting (SLM), direct metal laser sintering (DMLS), electron beam melting (EBM). In the exemplary embodiment, a system 95 includes a build platform 55 configured to fixture a build plate 50 during manufacturing and unloading process, one or more light sources $85_n$, one or more image recording devices $80_n$, one or more laser sources 65, an objective lens (i.e., f-theta lens) 75 configured to focus the laser beam (or energy) at a focal point used in conjunction with a galvanometer, beam expander, and laser source 65, one or more laser scanners having one or more mirrors $70_n$, and a powder delivery apparatus 90 configured to distribute powders 60 on the build plate 50, which further has a set of blades $91_n$. The image recording device includes any suitable types of camera, such as a charged-couple device (CCD) camera, a complementary metal-oxide semiconductor (CMOS) camera, an infrared (IR) camera, or a pyrometer, and so on. The powder deliver apparatus 90, also referred as a re-coater, moves along with p-axis of the build station 95, which deposits a plurality of layers 61 on the build plate 50. In the exemplary embodiment, the laser sources 65 may melt (or solidify) the applied powder layer 61 to fabricate a part (or parts) 600, and a plurality of validation coupons $700_n$ (optional). The exemplary system of disclosed embodiment also includes a local computer having a controller 800 configured to determine a defect and perform automatic corrective actions in real-time, and may distribute electronic ledger for tracking manufacturing process information associated with the preprocessed captured images and build parameters through networked shared server systems 850, e.g., cloud system. The distributed electronic ledger may also be encrypted. It is noted that the term for "feature-set" is extracted from a plurality of captured images in prediction session, and the term for "data-set" is extracted from a plurality of captured images in training session in the exemplary embodiment.

The powder delivery apparatus 90 is configured to distribute a plurality of powder materials 60 from powder hopper onto the build plate 50 to be sintered or melted during the additive manufacturing process for fabricating at least one part. The powder material 60 applies to, but not limited to, copper, aluminum alloy, Inconel, nickel alloy, chrome alloy, steel, and titanium alloy. The one or more laser sources 65 configured to sinter or melt of a distributed powder layer 61. An exemplary embodiment provides laser source 65 in yttrium fiber laser type configured to emit laser beam energy having a wavelength of about 1070 nanometers (nm). In some instances, the laser source 65 applies to, but not limited to, a carbon dioxide ($CO_2$) laser. The representative embodiment shown in FIG. 6 includes one laser source 65, but may comprise additional laser source as an option, which have various energy intensity. In one exemplary embodiment, the laser source is systemically coupled to a pair of mirrors $70_n$ which are controlled by a scanner, and that facilitates focusing laser beam on a target area of the applied powder layer 61. Even though the same intensity of laser energy 65 is applied to the powder layer 61, the applied energy thereto may differ depending on the velocity (or speed) of the scanner. Thus, the scanning speed actually affects the solidification quality of the powder layer.

The coupled controller 800 also includes a touch panel display 835 so that users may monitor and control the manufacturing process by manipulating graphic user interface. During the training session as shown in FIG. 3, the user may input adjustable build parameters in manual followed by inspection output of the manufactured part.

The build station is surrounded by a plurality of walls having a rectangular shape whereby a powder bed is formed, further including a build plate, a build platform, one or more laser sources, a pair of mirrors controlled by a scanner, an objective lens 75 (i.e., f-theta lens), one or more lighting sources, one or more image recording devices, a powder delivery apparatus, so-called re-coater, and a gas & pneumatic control system configured to maintain a desired oxygen rate within a chamber. The controller is connected to a local storage, or may link to an external cloud storage, or on a blockchain network.

The disclosed exemplary embodiment, a PBF system is configured to manufacture a part by layer-by-layer fabricating process. One or more planned parts to be built has its build information on a computer-aided design (CAD)/computer-aided manufacturing (CAM) file. The CAD/CAM file is required to convert into a layer-by-layer format to fabricate a three-dimensional part, and it should include its geometric information (e.g., geometric coordinate point where powder should melt at each layer) and build parameter information (e.g., laser power, and/or scanning speed). Thus, the converted job file contains sliced geometry of a three-dimensional part of each layer. In some instances, the converted job file may be loaded from a coupled external storage device or an external server. Once the job file 5 is loaded, which may be loaded from a coupled controller 800, the PBF system activates its coupled laser source 65, scanner having two mirrors 70n, powder delivery apparatus 90, gas & pneumatic control system according to predetermined setting of build parameters. The PBF system will repeat to scan layers according to this job file 5. In a representative embodiment, the laser source 65 may scan a plurality of validation coupons $700_n$ (e.g., validation coupons), in addition to a desired build part. The local controller 800, such as a computer, includes a touch panel display 835 with graphic user interface, so that a user may manipulate parameters through the touch panel display 835 during the build process or before the build process. In another embodiment, the controller 800 may also include a mouse or a keyboard, as well as, other display types externally or internally and so on.

In the present disclosure of exemplary embodiment, the "parameter" refers to characteristics build information which controls and determines its manufacturing environment, such as intensity energy of laser source 65, a scanning speed (or velocity) of laser source, a path of laser source, and dose factor of powder delivery apparatus, but not limited to. The parameters may be input or adjusted by a user on or before the manufacturing process. In some implementations, the parameters may be adjusted automatically applied through a predictive model where the model calculates adjustment build parameters to be update.

At least one image recording device coupled to a controller is shown in FIG. 6. In another representative embodiment, the image recording device may be located inside the build station (e.g., opposite sides on the build station, but not limited to) to capture a plurality of images of a target area at the end of each powder distributing process and scanning process.

Figure 6C:
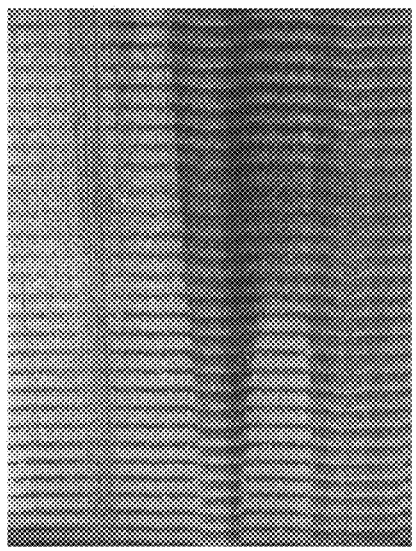
FIGS. 6a to 6c are examples of captured images illustrating detected defects from applied powder layer(s) during additive manufacturing process according to an exemplary embodiment.
Figure 6B:
Figure 6A:
Figure 7:
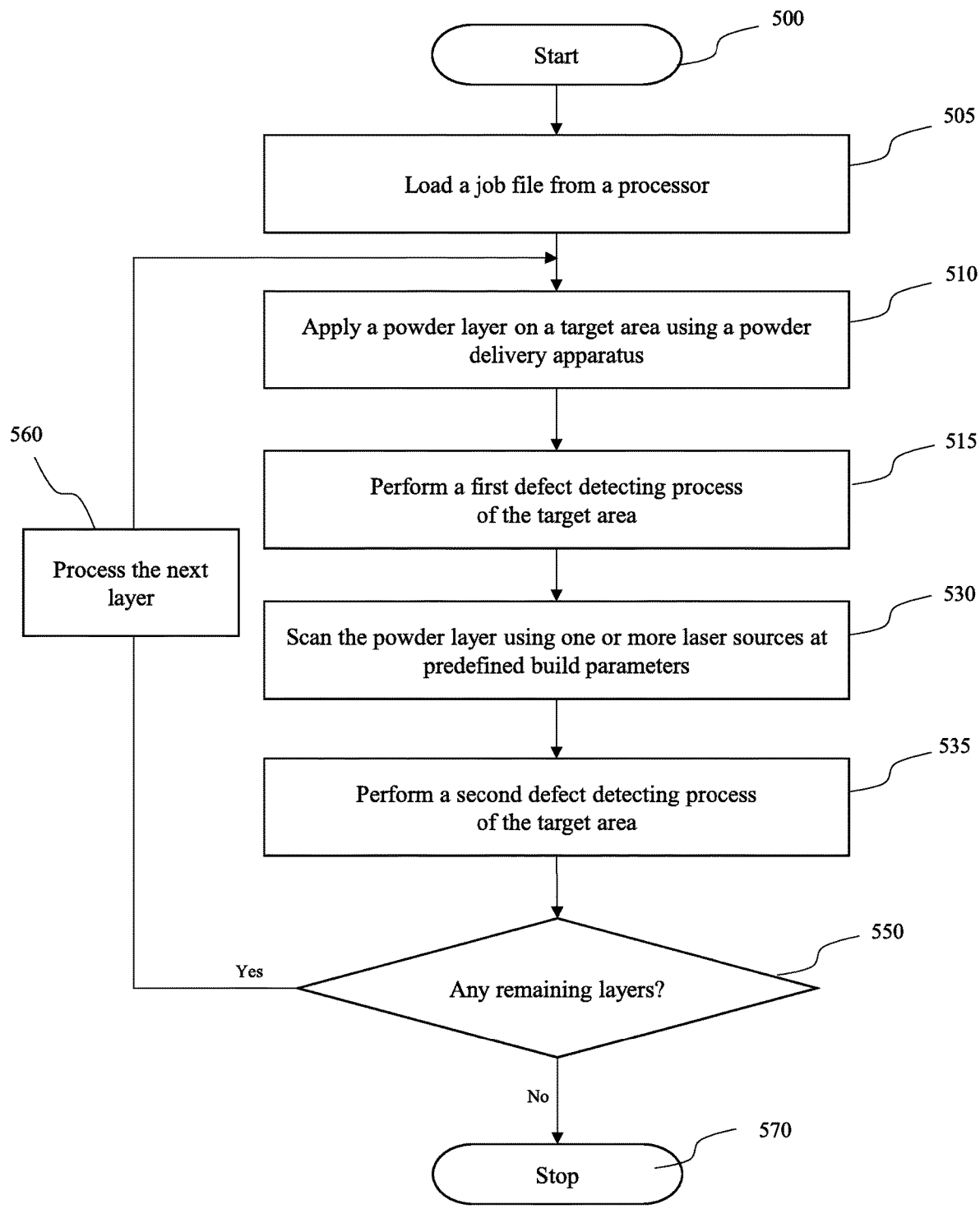
FIG. 7 is a flow chart illustrating steps of manufacturing a part, monitoring its process quality and performing automatic corrections of detected defects according to an exemplary embodiment.

FIGS. 6a to 6c are examples of captured images illustrating detected defects from applied powder layer(s) during additive manufacturing process according to an exemplary embodiment. As shown in FIGS. 6a and 6b, some characteristic patterns, such as rapid contrast changes and horizontal scratch patterns derived from something on the re-coater 90 (i.e., powder delivery apparatus) blades 91n, are represented in the captured images after applying the powders on the build plate. The captured image then would be processed through computer-vision based system, and then applied to a first defect detecting process 515 as shown in FIG. 7. For example, the rapid changes of contrast and relatively large dimensions thereof may be determined as a short feeding defect, and the scratch patterns may be determined as a re-coater blade issue. Additionally, from the plurality of regular wave patterns, it may be determined as a defect in re-coater operations such as corresponding motor. The captured image data having such a characteristic is being collected, stored and learned so as to classify an image of this tendency into a label. However, it is noted that such defects may require to stop the process, and to manually fix the motor, feed powders into hopper, and replace or clean the re-coater blades. In other words, these compensational operations may not be conducted automatically. In such case, alert may be given to user may through user interface. In a case of short feeding issue in small area, which is below a predefined tolerance value, the build parameters of enhancing powder dose factor may be conducted automatically based on a predictive model.

FIG. 7 is a flow chart diagram illustrating a representative method embodiment, and provides a useful summary. The method begins, start step 500, as described above, with loading a job file from a processor, wherein the job file converted into a sliced into two-dimensional geometry information layer-by-layer, step 505, and applying a powder layer on a target area using a powder delivery apparatus 90, where the target area is where on the powder layer selectively would melted or solidified by laser source 65, step 510. A first defect detecting process of the target area would be performed, wherein the first defect detecting method associated with a powder distribution quality monitoring, step 515, then scan the powder layer 61 using one or more laser sources 65 at predefined build parameters, step 530, and perform a second defect detecting process of the target area, wherein the second defect detecting method associated with a solidification quality monitoring, step 535. Following the performing second defect detection process step 545, the method may end 570 if there is no remaining layer to fabricate, or may process the next layer to step 560 and iterating.

Figure 8:
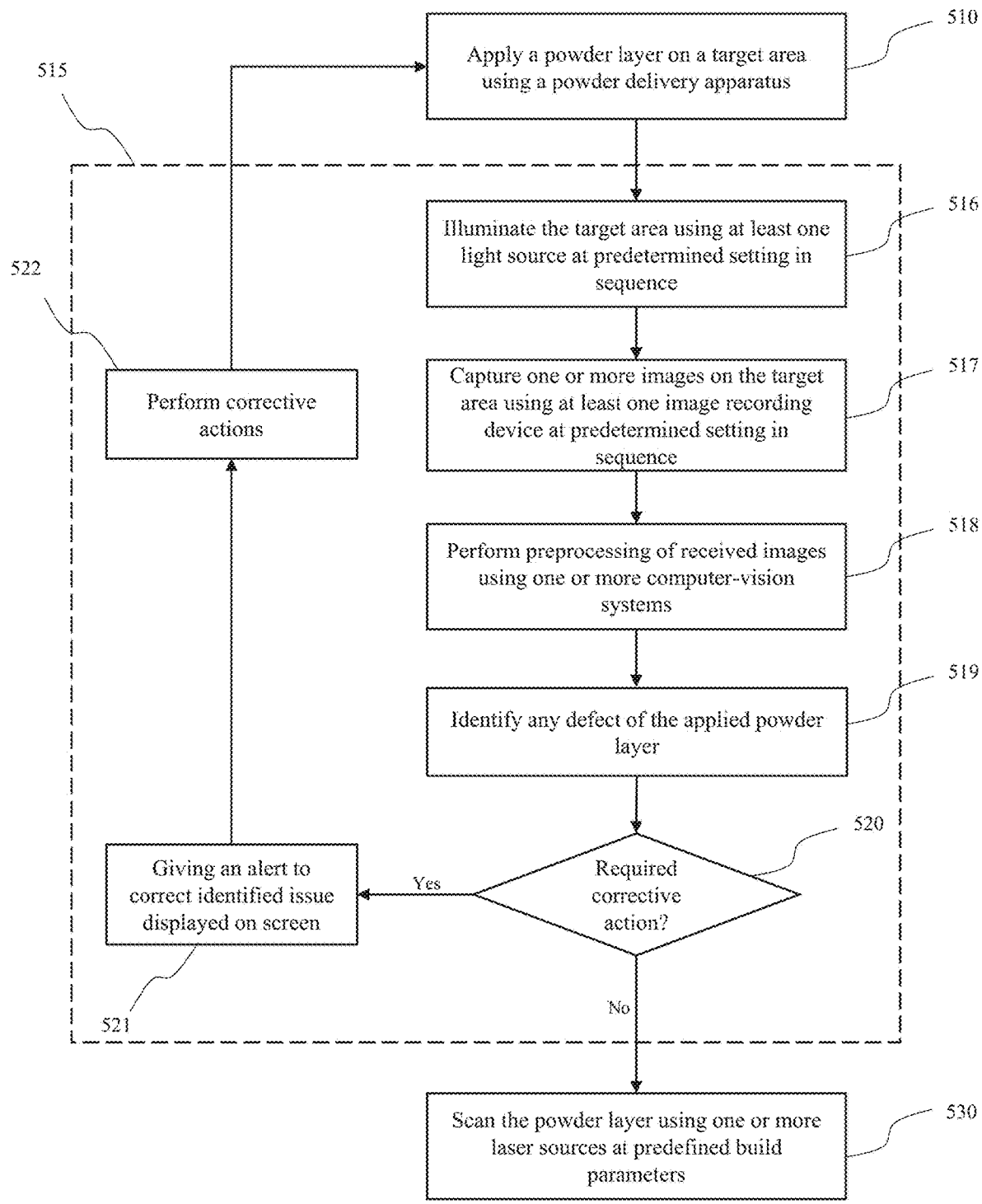
FIG. 8 is a flow chart illustrating steps of detecting defects from applied powder layer(s) during additive manufacturing process according to an exemplary embodiment.
Figure 10:
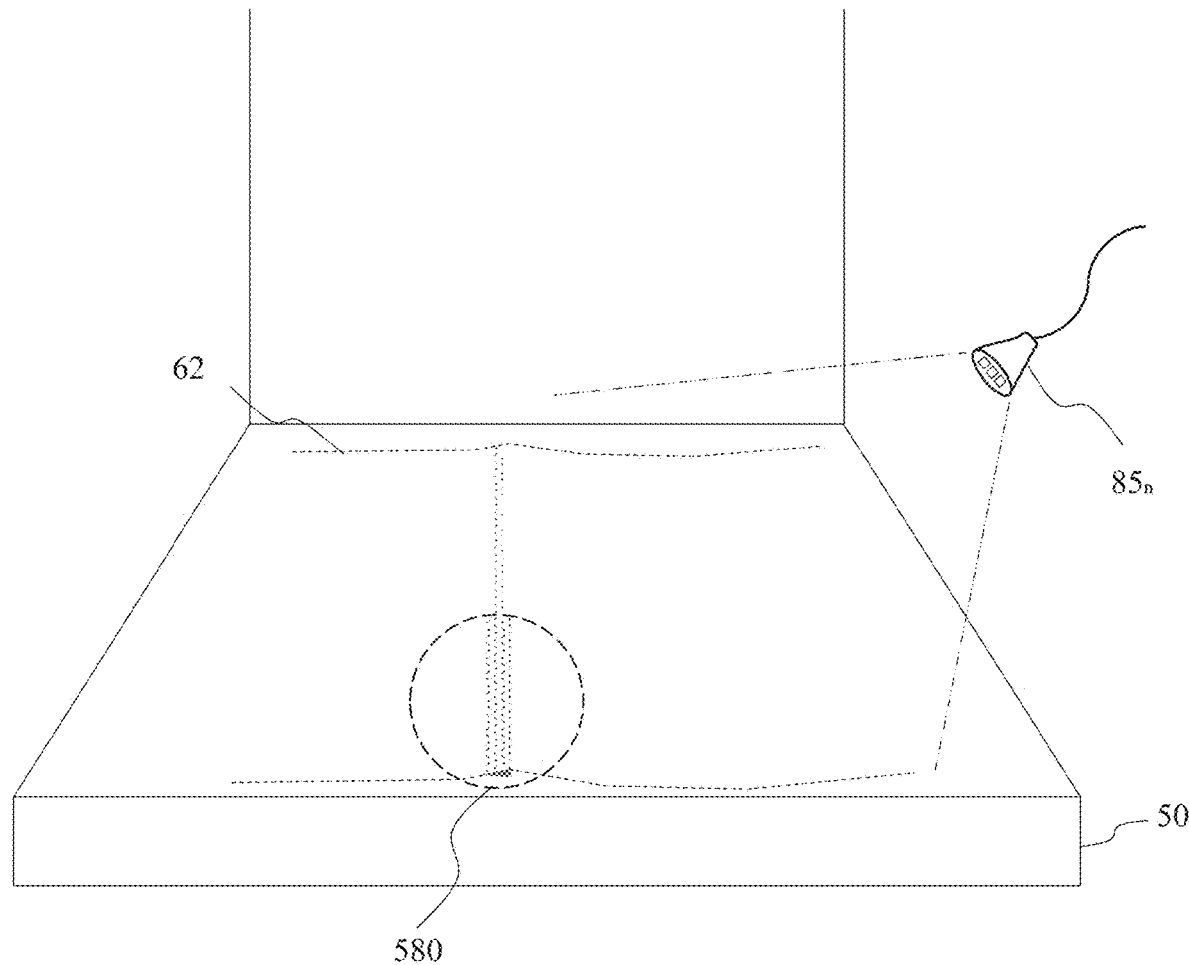
FIG. 10 is a schematic view of an embodiment illustrating an example of shadow on the applied powder layer derived from at least one light source which illuminates at a predetermined angular orientation.

FIG. 8 is a flow chart diagram illustrating the first representative method embodiment referred to FIG. 7, and also provides a useful summary. The method begins, step 516, with illuminating the target area using at least one light source at predetermined setting in sequence. The predetermined setting in sequence for light source is configured to obtain an optimal angular orientation to capture any defects possible have as shown in FIG. 10. In some implementations, unevenly coated powder layer 62 may have a shadow 580 which may be relatively noticeable under certain direction of a light source 85n. In some instances, a plurality of light sources may be installed in opposite sides of build station 95 to minimize scattering from highly reflective surface of solidified parts, as well as being installed on all sides or diagonals thereof, but not limited to. The predetermined setting in sequence of light source may be initiated by a user. One or more images on the target area would be captured using at least one image recording device at predetermined setting in sequence, wherein the captured image contains a coated powder layer, step 517, and preprocessing of received images would be performed using one or more computer-vision based systems, step 518. The predetermined setting in sequence of taking images may also be referred by statistic from training. These predetermined setting in sequence may affect the output of preprocessed images, which indicates a characteristic thereby to obtain an optimal output for being used in a predictive model. In some instances, the controller 800 may utilize one or more computer-vision based systems which may require an optional GPU 870 to process heavy data in real-time as shown in FIG. 13*b*. Once the preprocessed image applied to a predictive model 200, then it identifies any defect of the applied powder layer from the extracted data-set (i.e., the preprocessed images), step 519, thereby determines any corrective actions to be followed, step 520. For example, one or more defect may be detected by calculating changes of contrast to ensure the applied powder layer is evenly distributed, or calculating dimension of less distributed or unapplied area of the applied powder layer. In another exemplary embodiment, the predictive model optionally may perform if any contour is seen in an unevenly applied powder layer.

Figure 12B:
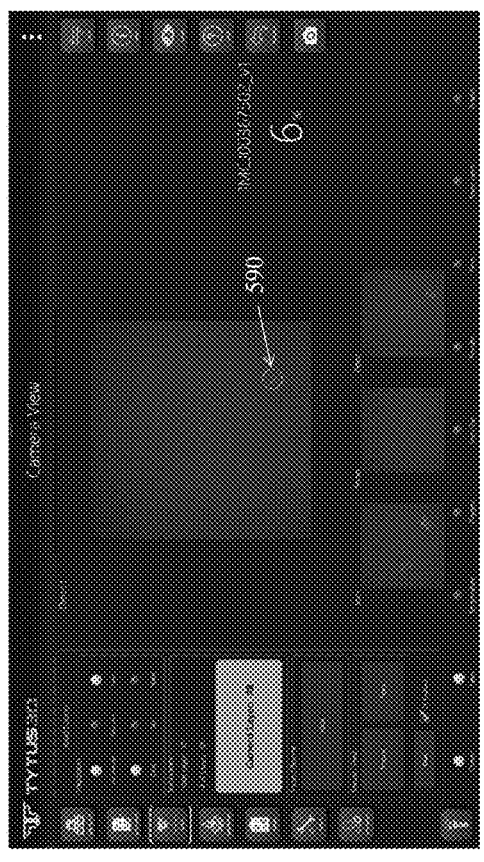
FIGS. 12a to 12b are examples of captured images of a graphic user interface illustrating detected defects during manufacturing process according to an exemplary embodiment.

When a decision is made for correcting the defect, the controller then gives an alert to correct identified issue displayed on the coupled screen, step 521, as shown in FIG. 12*b*, or may return step 530 if adjustment is not required. Following the performing correction step 522, the method may return step 510, or may be returning to step 516 and iterating.

Figure 9:
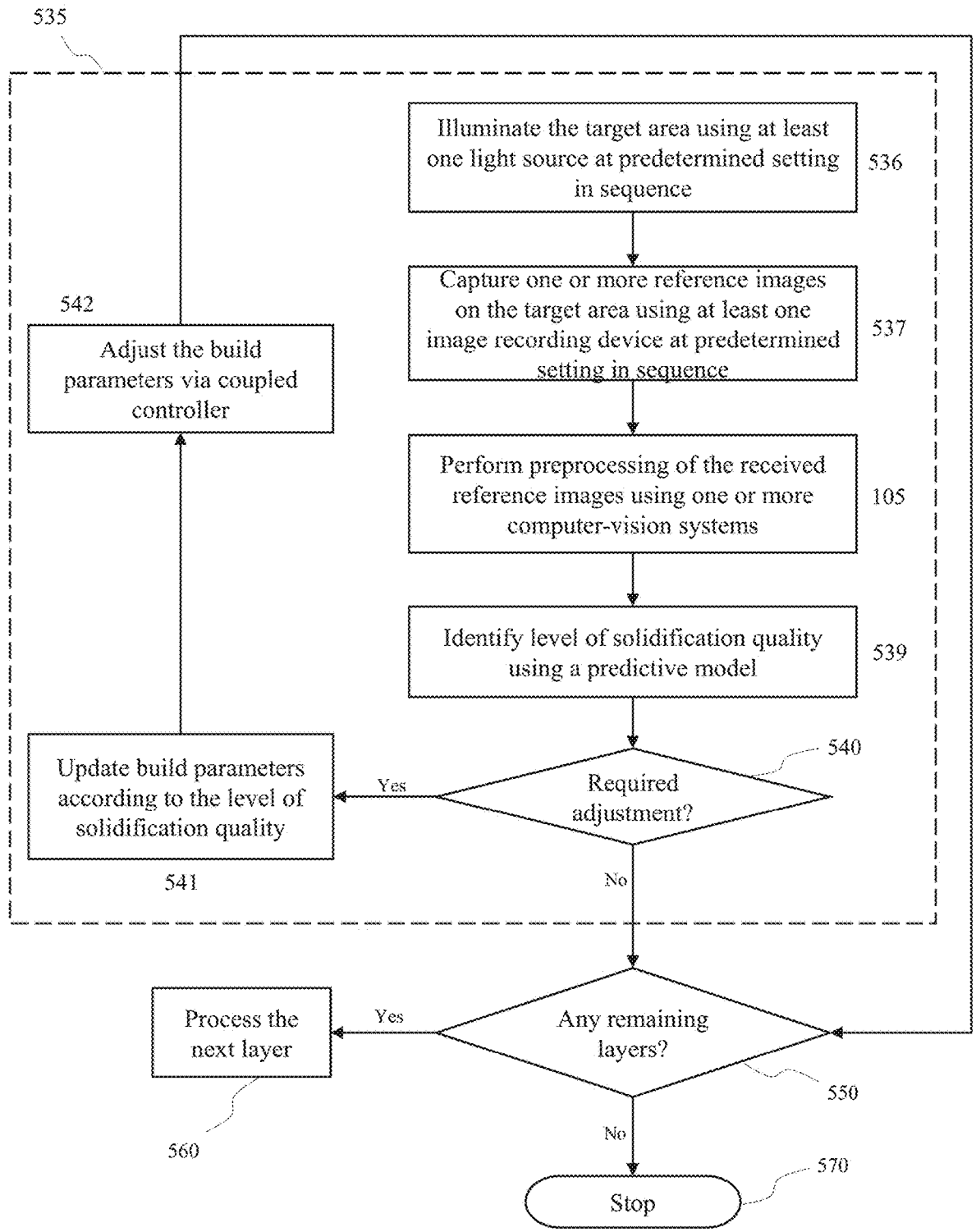
FIG. 9 is a flow chart illustrating steps of detecting defects from solidified scanned layer during additive manufacturing process according to an exemplary embodiment.
Figure 11A:
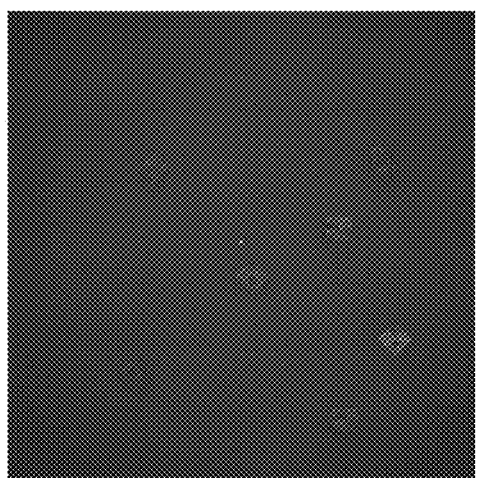
FIGS. 11a to 11f are examples of captured images illustrating steps of detecting one or more defects from solidified scanned layer and applied powder layer during additive manufacturing process according to an exemplary embodiment.
Figure 11B:
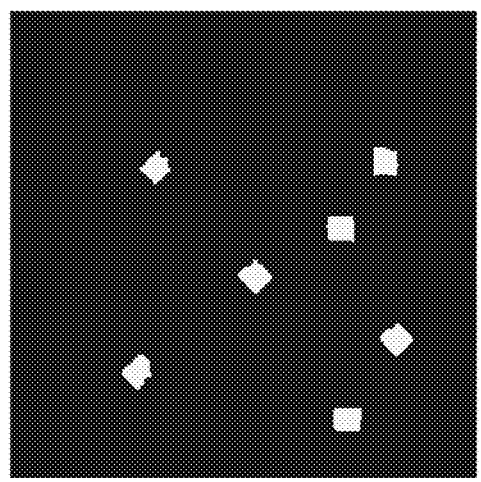

FIG. 9 is a flow chart diagram illustrating the second representative method embodiment referred to FIG. 7, and provides a useful summary. The method begins, start step 536, with illuminating the target area using at least one light source 850 at predetermined setting in sequence, step 537, and capturing one or more reference images on the target area using at least one image recording device 830 at predetermined setting in sequence. As described above, the predetermined setting in sequence for one or more light source and one or more image recording devices enable to output a characteristic curve when preprocessing. The reference images described in step 537 refer to the images having one or more solidified surfaces that selectively melted powder layer with at least one laser source. An example of the captured reference image is shown in FIG. 11*a* indicating a plurality of solidified part surfaces. The one or more computer-vision based systems may preprocess the captured reference images to extract feature-set, step 105, as described above, and may generate curves from the feature-set having variations per image in captured sequence. When the computer-vision based system processes the captured image, cut out the unsolidified powder portion and selectively segment transmit the solidified portion only for extracting feature-set to save processing time and process it effectively, as shown in FIG. 11*b*. After then, identify the level of solidification quality using a predictive model, step 539. The present disclosed embodiment of system then applies the feature-set into a predictive model to calculate correlations from the feature-set and labeled data-set. In some instances, optionally apply the extracted feature-set only to the predictive model. Then the model 200 determines whether any adjustment of build parameters is required or not, step 540. The predictive model identifies corresponding labels according to the feature-set (e.g., curves or image feature-set) to calculate level of solidification quality. After calculated, step 541, update the build parameters according to corresponding labeled feature-set, if it is determined to be "bad" quality, for example. Accordingly, adjust the build parameters via coupled controller 542 automatically. Following the performing correction step 542, the method may proceed step 560 if there is any remaining layer 550, or may be returning to step 550 and iterating.

A schematic view of an embodiment illustrating an example of shadow 580 on the applied powder layer 62 derived from at least one light source 85*n* which illuminates at a predetermined angular orientation is shown in FIG. 10. In some implementations, when one or more light sources illuminate a target area, more specifically, when one or more light sources at an oblique angle, one or more shadows may be identified if there is unevenly coated layer. As such, there may be a patterned feeding or short feeding on the powder layer. Accordingly, to enhance possibilities of detecting these defects, the representative embodiment may place a plurality of light sources in various locations at various angular orientation. The computer-vision based system identifies the shadow portion of the image, and accordingly performs sampling process, i.e., feature extraction, to find whether the shadow exceeds the preset tolerance value. In some implementations, the light source may be a light emitted diode (LED), a laser light, a solid-state lighting (SSL), a light-emitting diode (PCLED), a fluorescent lamp, or an incandescent light bulb, but not limited to.

Figure 11C:
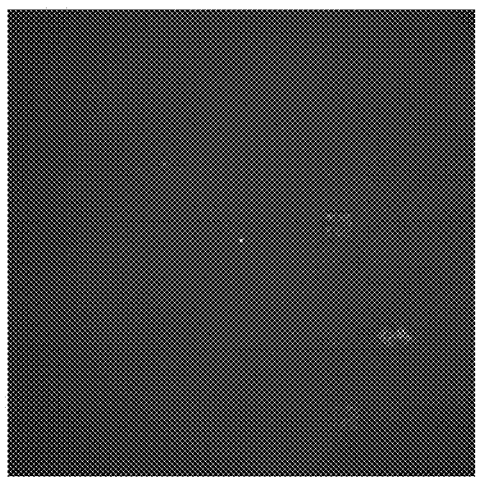
Figure 11D:
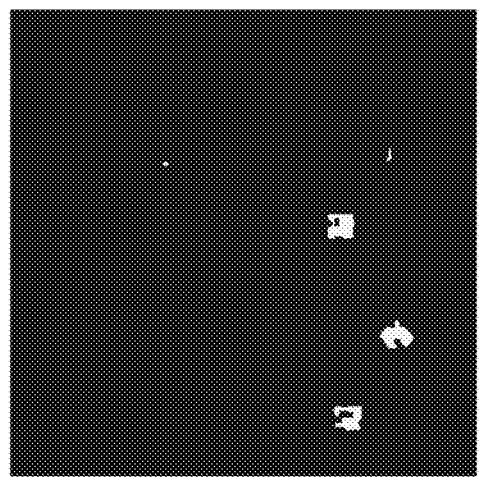
Figure 11F:
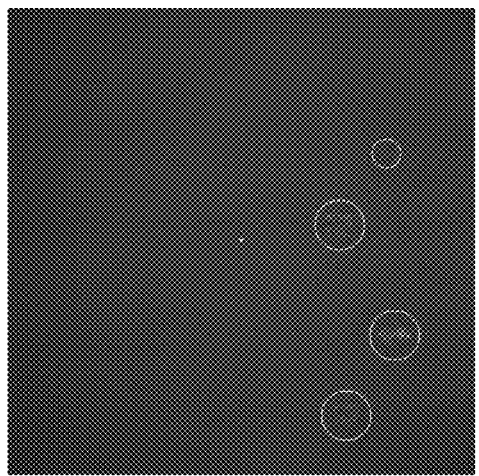
Figure 11E:
Figure 11E:
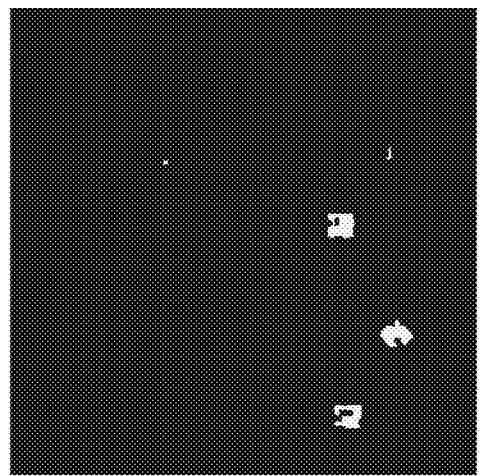

FIGS. 11*a* to 11*f* are examples of captured images illustrating steps of detecting one or more defects from solidified scanned layer and applied powder layer during additive manufacturing process according to an exemplary embodiment. These FIGS. 11*a* to 11*f* indicate an example of preprocessing of the captured images. FIG. 11*a* is an example image captured after solidifying a plurality of parts. FIG. 11*b* is a processed image of FIG. 11*a* for efficient and selective analysis of the solidified portion only, thereby to save processing time and transmitting data size, as described above. FIG. 11*c* is an example image captured after applying a powder layer following the process shown in FIG. 11*a*. FIG. 11*d* is a processed image of FIG. 11*c* for selectively emphasizing the defectively applied portion of the powder layer by detecting remaining solidified part from the applied layer powder. FIG. 11*e* is an output image of comparison FIGS. 11*b* and 11*d* to ensure defectively applied area by detecting portion of remaining solidified part. This process takes less time compare to direct comparison between original images. Following the processes described above, the user interface screen displays the defective portion of the applied powder layer in a plurality of circles.

Figure 12A:
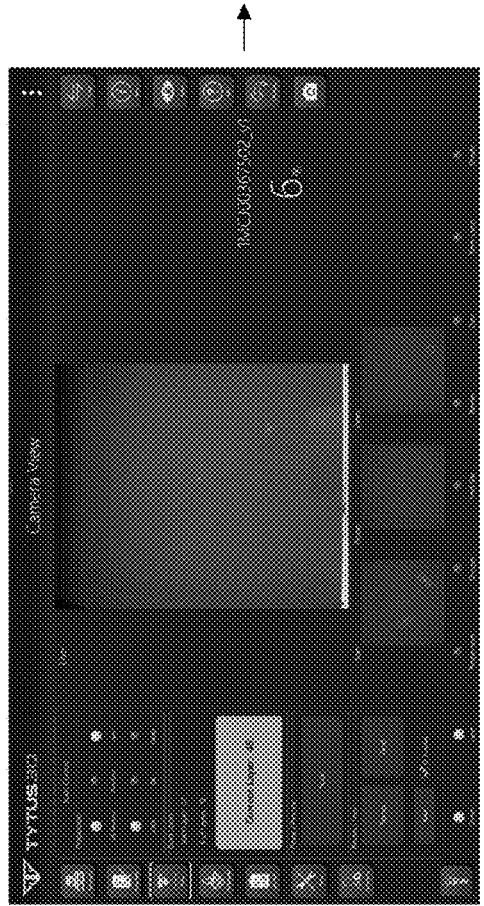

FIGS. 12*a* to 12*b* are examples of captured images of a graphic user interface illustrating detected defects during manufacturing process according to an exemplary embodiment. FIG. 12*a* is a captured image of user interface after recoating process 510 and FIG. 12*b* is a captured image of user interface at the end of a first defect detecting process 515. In the exemplary embodiment, at the end of the first defect detecting process 515, the user interface may display the defect detecting result 521 on the screen with a circle 590, which means the applied powder layer has a defect in the circle area.

Figure 13A:
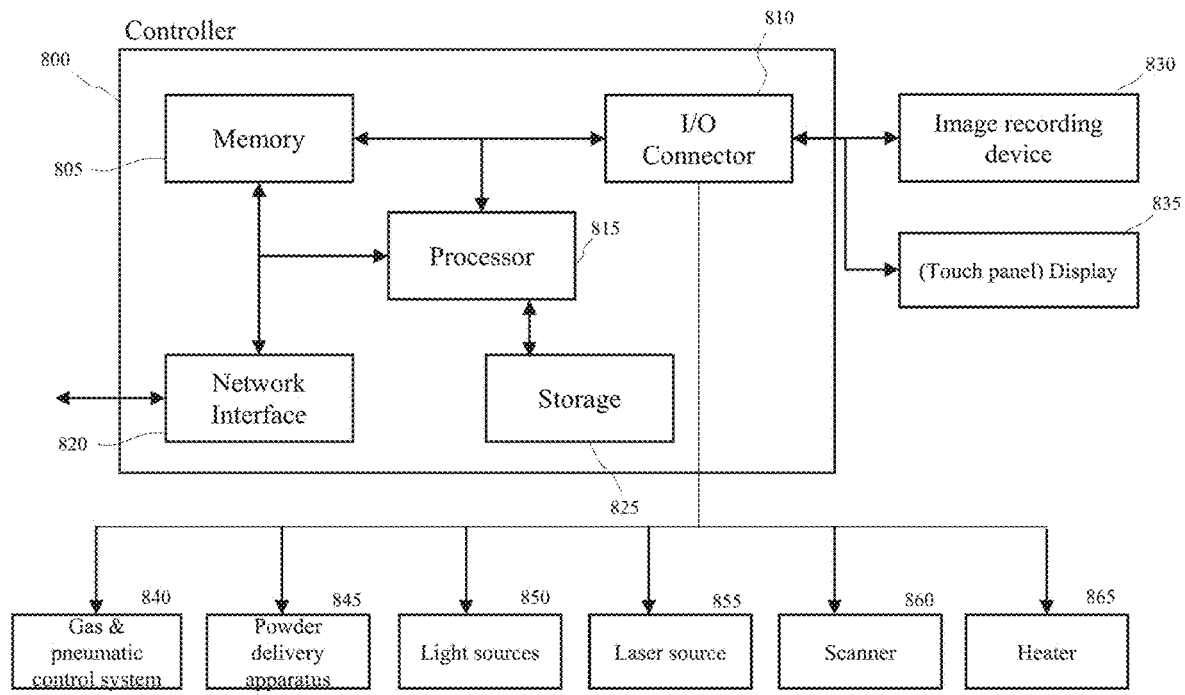
FIG. 13a is a block diagram of an exemplary embodiment illustrating a controller, also referred as a computer, used for a system for real-time defect detection and correction in additive manufacturing environment.
Figure 13B:
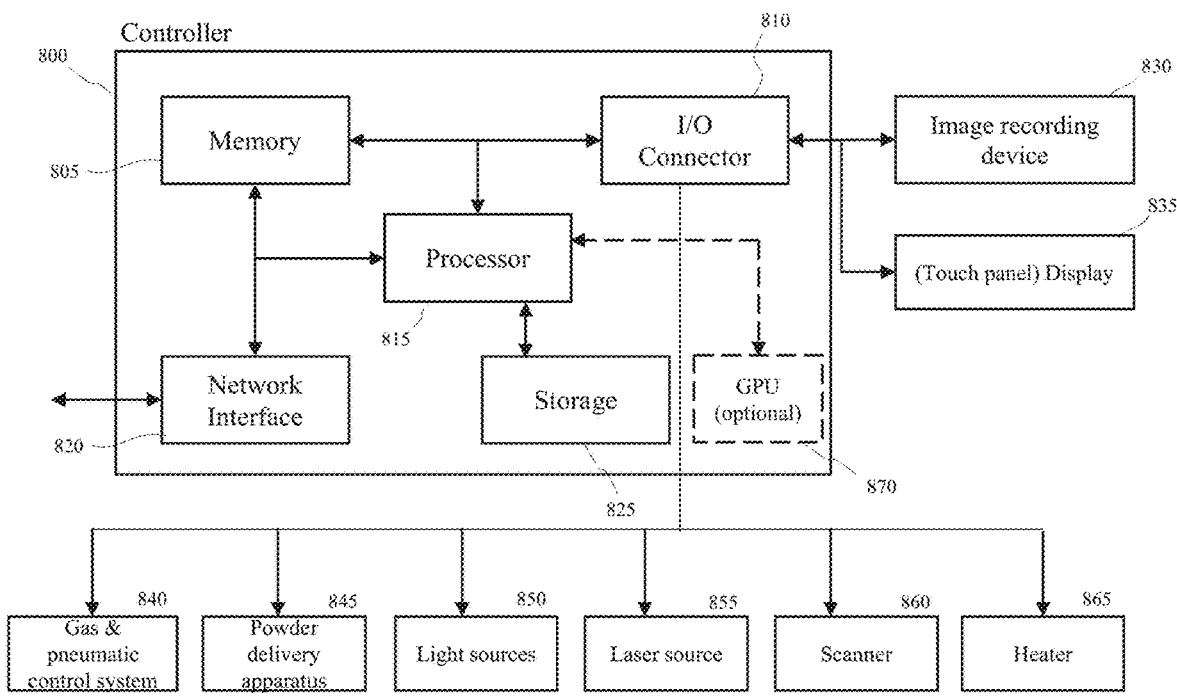
FIG. 13b is a block diagram of an exemplary embodiment illustrating a controller, also referred as a computer, having optional device(s) used for a system for real-time defect detection and correction in additive manufacturing environment.

FIG. 13*a* is a block diagram of an exemplary embodiment illustrating a controller, also referred as a computer, used for a system for real-time defect detection and correction in additive manufacturing environment. As shown in FIG. 13*a*, the controller 800, such as computer, includes a plurality of components, such as a processor 815, a memory 805, an input-output (I/O) connector 810, and a network interface 820, In the exemplary embodiment, the controller 800 may include an analog to digital converter, and/or filter. The controller 800 may be connected to at least one image recording device 830, at least one laser source 855, a laser scanner 860, at least one light source 850, at least one powder delivery apparatus 845, a gas control system 840, a user interface display device 835, and so on. In this exemplary of embodiment, to manufacture a planned part, a job file 5 and corresponding build parameters 15 are required. In another exemplary of embodiment, the build parameters 15 corresponding to the job file 5 may also include corresponding powder applying process, inert gas and pneumatic controls, and ventilation processes. This may enable to obtain an optimum environment to manufacture a desired part in good quality. For example, the controller 800 may control build parameters for adjusting flow rate and on/off operations with gas & pneumatic control system 840, adjusting powder dose factor and on/off operations with powder delivery apparatus 845, adjusting directions or on/off operations with one or more light sources 850, adjusting energy intensity and frequency with one or more laser sources 855, adjusting speed (velocity) and positioning path with scanner 860, and adjusting heat temperature and on/off operations with heater installed in the build plate 865, but not limited to, via coupled an I/O connector 810.

FIG. 13b is a block diagram of an exemplary embodiment illustrating a controller, also referred as a computer, having optional device(s) used for a system for real-time defect detection and correction in additive manufacturing environment. In case of process heavy data, such as a plurality of high resolution images, additional device may be needed to perform the process. FIG. 13b is another scenario of circuitry configuration for a controller of FIG. 13a having an optional GPU.

Figure 14:
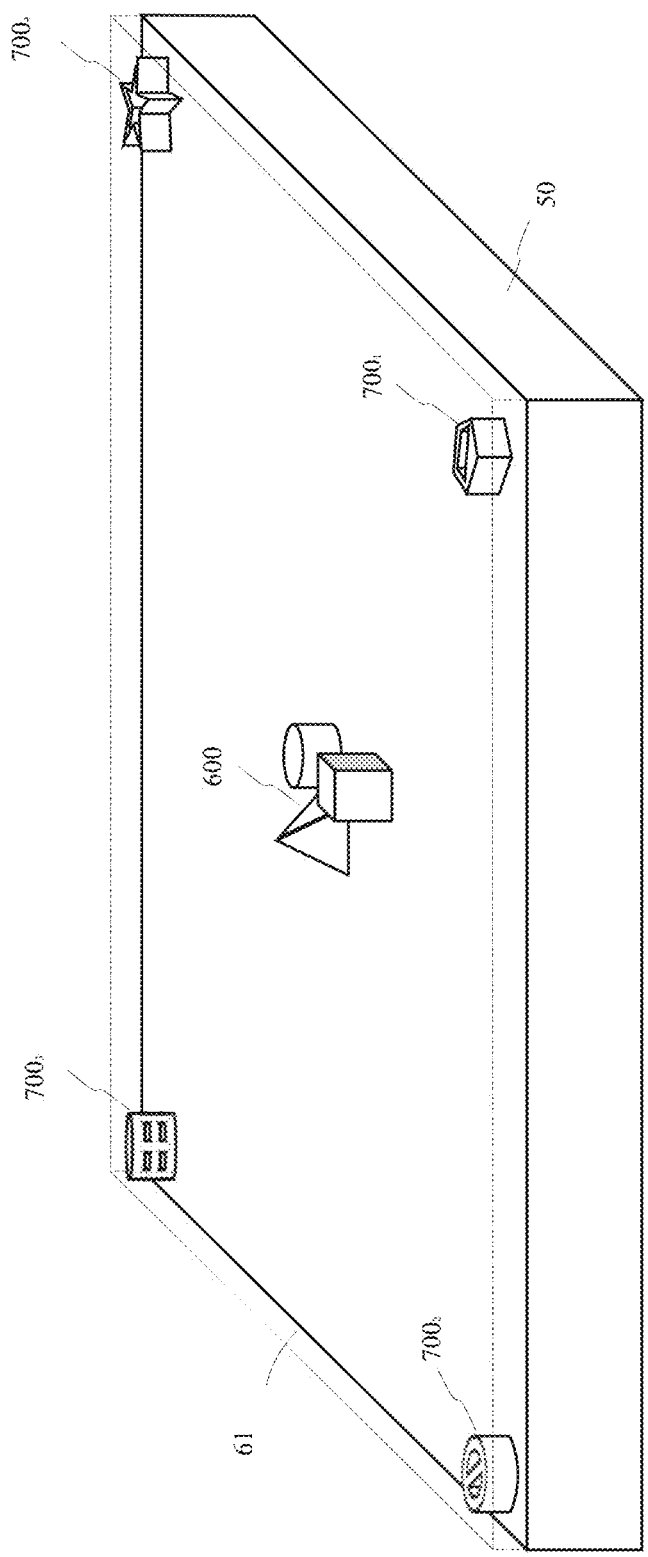
FIG. 14 is an isometric view of an exemplary embodiment illustrating a plurality of physical validation coupons in a system for real-time defect detection and correction in additive manufacturing environment.

FIG. 14 is an isometric view of an exemplary embodiment illustrating a plurality of physical validation coupons 700n in a system for real-time defect detection and correction in additive manufacturing environment. One or more validation coupons 700n may be located near the corner of the top build plate 50. The validation coupons 700n may have a hollow portion having an edge, or a solid portion, but not limited to. The shape of the validation coupon is various, the shape can be complicated such as an angular figure, a lattice shape, a honeycomb shape, a hollow cylindrical shape, a tapered shape, or a solid portion having a curved shape, but not limited to. In this exemplary of embodiment, the captured image of the validation coupon may have its specific identifier codes layer by layer, which may enable to client to identify the data through shared network. In some implementations, this data may be distributed electronic ledger for tracking manufacturing process information associated with the preprocessed captured images and build parameters through networked shared server systems 850, e.g., cloud system. The distributed electronic ledger may also be encrypted.

In some instances, there may be some geometric defects near any edges of the build plate when fabricating a part using one laser source 850 scanning through a window on the ceiling of the chamber which is within the build station. The coupons 700n may be located near the edge of the build plate 50, and if is determined that the coupons 700n are well manufactured through physical analysis, then a desired part may be also assumed as well-manufactured. Based on this assumption, the present disclosure employs one or more validation coupons 700n. In some implementations, the disclosed method may reduce the processing time of image analysis for each layers via computer-vision based system. Image processing techniques take longer time, generally, and it may even get worse if the detected pattern is relatively complicated one. Based on this assumption described above, performing pattern matching and/or color contrast analysis for the field of validation coupons is effectively fast and statistically accurate rather than performing pattern matching and/or color contrast analysis for the entire fabricated part. In some instances, a plurality of image recording devices may be located within the build station for capturing only the plurality of validation coupons. Thus, during the image analysis, such as pattern matching techniques, the processor does not need to prepare additional preprocessing for trim the image for the validation coupon field only. The plurality of image recording devices fixed at specific location to capture field of the plurality of validation coupons only are configured to save the image processing time. In some implementations, each captured data of the plurality of validation coupons may be shared through external servers 850 as an electronic ledger format having an identifier code.

Figure 15:
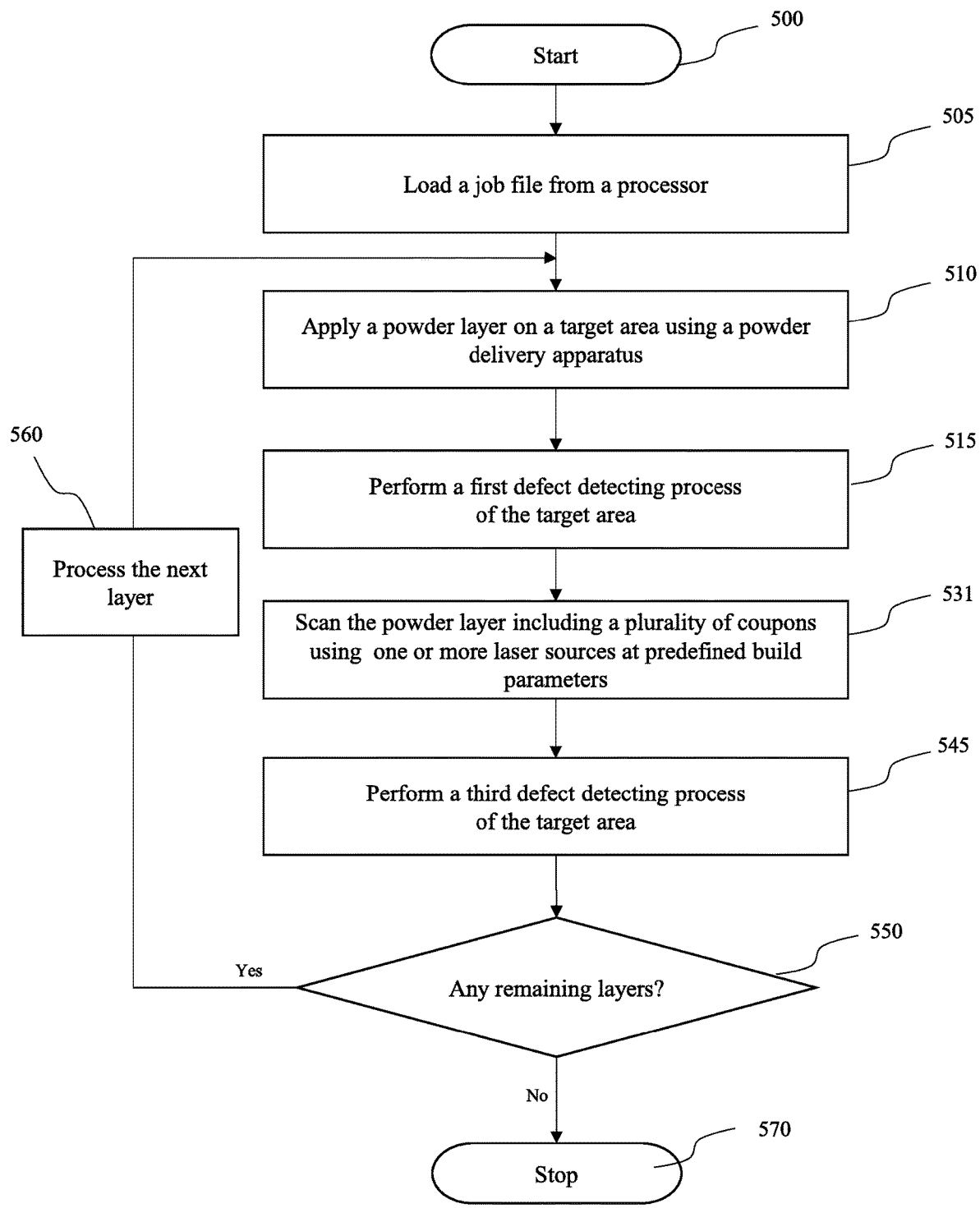
FIG. 15 is a flow chart illustrating steps of manufacturing a part with a plurality of validation coupons, monitoring its process quality and performing automatic corrections of detected defects according to an exemplary embodiment.

FIG. 15 is a flow chart illustrating steps of manufacturing a part with a plurality of validation coupons, monitoring its process quality and performing automatic corrections of detected defects according to an exemplary embodiment. FIG. 15 is another scenario of in real-time defect detection and correction in additive manufacturing environment of FIG. 7. In this exemplary of embodiment, a trained model may perform classifications to analyze only captured image of the plurality of validation coupons, based on a trained predictive model. The method begins, start step 500, as described above, with loading a job file from a processor, wherein the job file is converted into a sliced into two-dimensional geometry information layer-by-layer, step 505, and applying a powder layer on a target area using a powder delivery apparatus 90, where the target area is where on the powder layer selectively would melted or solidified by laser source 65, step 510. A first defect detecting process of the target area would be performed, wherein the first defect detecting method associated with a powder distribution quality monitoring, step 515, then scan the powder layer 61 using one or more laser sources 65 at predefined build parameters, step 531, and perform a third defect detecting process of the target area, wherein the second defect detecting method associated with a solidification quality monitoring, step 545. Following the performing second defect detection process step 545, the method may end 570 if there is no remaining layer to fabricate, or may process the next layer to step 560 and iterating.

Figure 16:
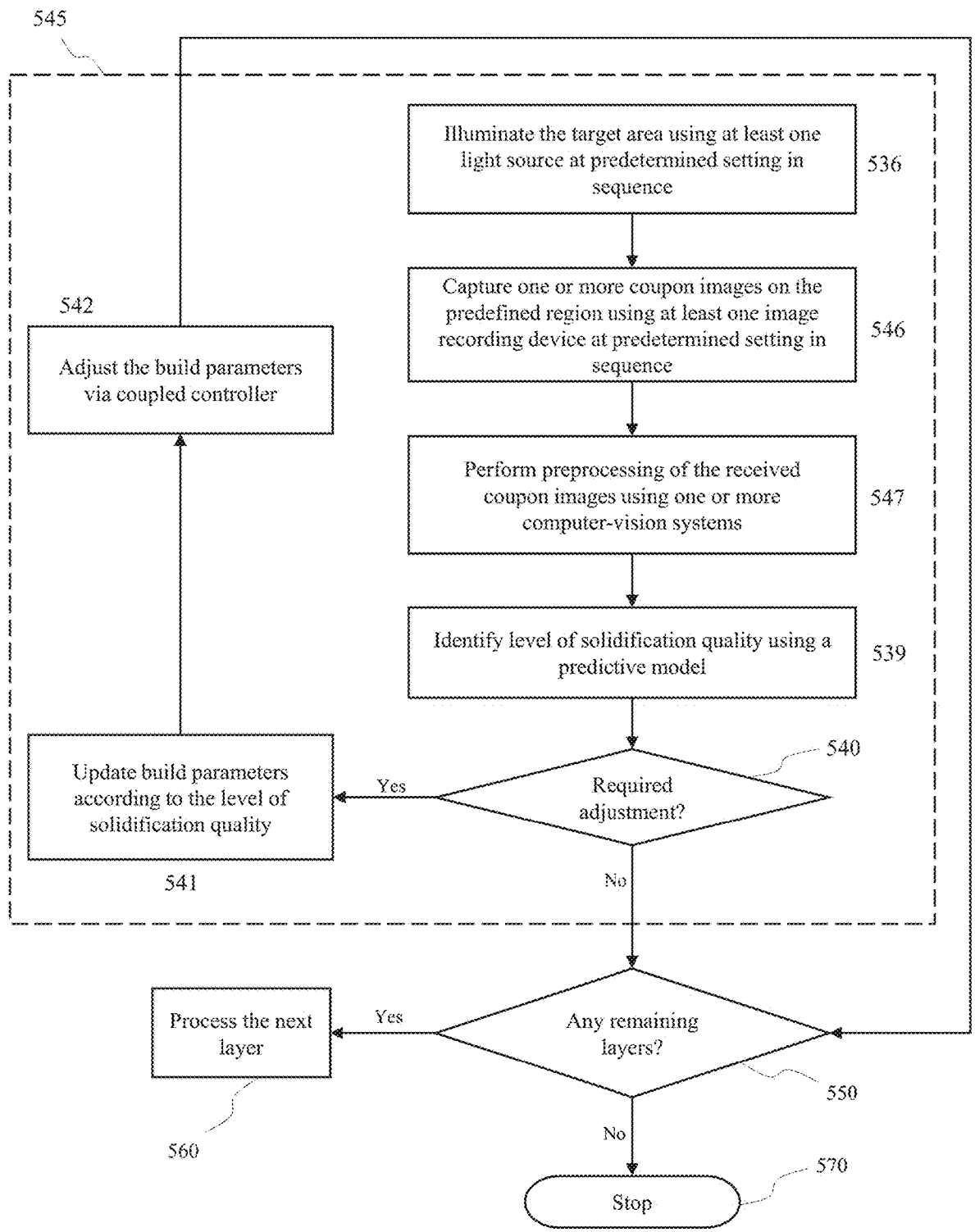
FIG. 16 is a flow chart illustrating steps of detecting defects from solidified scanned layer with a plurality of validation coupons during additive manufacturing process according to an exemplary embodiment.

FIG. 16 is a flow chart illustrating steps of detecting defects from solidified scanned layer with a plurality of validation coupons during additive manufacturing process according to an exemplary embodiment. a flow chart diagram illustrating a third representative method embodiment, and also provides a useful summary. FIG. 16 is another scenario of method for detecting defects from solidified scanned layer during additive manufacturing process of FIG. 9.

The method begins, start step 536, with illuminating the target area using at least one light source 850 at predetermined setting in sequence, step 537, and capturing one or more coupon images on the target area using at least one image recording device 830 at predetermined setting in sequence. As described above, the predetermined setting in sequence for one or more light source and one or more image recording devices enable to output a characteristic curve when preprocessing. In some instances, data sources can be used to obtain statistics that are considered an optimal setting for corresponding build parameters and a job file. The coupon images described in step 546 refer to the images having one or more solidified validation coupon surfaces that selectively melted powder layer with at least one laser source. The one or more computer-vision systems may preprocess the captured coupon images to extract feature-set, step 105, as described above, and may generate curves from the feature-set having variations or changes per image in captured sequence. When the computer-vision system processes the captured images of the coupons, each image's size becomes considerably lighter due to its limited field size and resolution, so it may be enable to save processing time and process it effectively. In specifically, identifying geometry information between planned information and the plurality of solidified coupon is taking less processing time than conventional process.

After then, identify the level of solidification quality using a predictive model, step 539. The present disclosed embodiment of system then applies the feature-set into a predictive model to calculate correlations from the feature-set and labeled data-set. In some instances, optionally apply the extracted feature-set only to the predictive model. Then the model 200 determines whether any adjustment of build parameters is required or not, step 540. The predictive model identifies corresponding labels according to the feature-set (e.g., curves or image feature-set) to calculate level of solidification quality. After calculated, step 541, update the build parameters according to corresponding labeled feature-set, if it is determined to be "bad" quality, for example. In another exemplary of embodiment, adjusting build parameters, such as increasing laser energy intensity, decreasing scanning speed, and so on, may be desired to perform at step 541. Accordingly, adjust the build parameters via coupled controller 542 automatically. Following the performing correction step 542, the method may proceed step 560 if there is any remaining layer 550, or may be returning to step 570 and iterating.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

A processor 815, with its associated memory 805, may be adapted or configured (via programming, FPGA interconnection, or hard-wiring) to perform the methodology of the invention, as discussed above. For example, the methodology may be programmed and stored, in a processor 815 with its associated memory 805 and other equivalent components, as a set of program instructions or other code (or equivalent configuration or other program) for subsequent execution when the processor is operative (i.e., powered on and functioning). Equivalently, when the processor 815 may be implemented in whole or part as FPGAs, custom ICs and/or ASICs, the FPGAs, custom ICs or ASICs also may be designed, configured and/or hard-wired to implement the methodology of the invention.

The memory 805 which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 815), whether volatile or non-volatile, whether removable or non-removable, including without limitation RAM, FLASH, DRAM, SDRAM, SRAM, MRAM, FeRAM, ROM, EPROM or E2PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. The memory 805 may be adapted to store various look up tables, parameters, coefficients, other information and data, programs or instructions (of the software of the present invention), and other types of tables such as database tables.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

"optional" or "optionally" means that the subsequently described event or circumstance may or may not occur, and that the description includes instances where the event occurs and instances where it does not.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A method for detecting a defect and identifying a corrective action for the defect in real-time during additive manufacturing process, the method comprising:
    receiving a plurality of captured images only of one or more solidified parts on a target area at a predetermined setting in sequence, wherein the predetermined setting is using at least one light source having at least one specific angle and direction at least one specific location, and at least one image recording device having at least one specific angle and direction at least one specific location at each layer;
    preprocessing the received captured images in sequence to extract feature-set;
    generating at least one curve from the feature-set, wherein the curve is a function generated from a feature-set by matching a preprocessed image only captured in each layer in real-time to data sources during a manufacturing process, wherein the function further comprising changes of each data sources at each layer during the manufacturing process;
    applying the at least one curve to a predictive model to calculate a level of solidification quality, wherein the predictive model is trained based on training data-set with at least one curve from a plurality of preprocessed captured images only in sequence and updated build parameters values based on a level of solidification quality from inspection output; and
    determining one or more build parameters values to be updated, if the predictive model detects a defect and to suppress the defect.

2. The method of claim 1, wherein the target area is an area of applied powder layer on a build plate where a desired part is fabricated through laser scanning.

3. The method of claim 1, wherein the feature-set is extracted from a plurality of captured images in prediction session, and the data-set is extracted from a plurality of captured images in training session.

4. The method of claim 1, wherein the predetermined setting further comprising selectively turning on one or more light sources to change the amount of light illuminating the target area.

5. The method of claim 1, wherein the predictive model is generated based on the steps from:
    collecting data sources with preprocessed captured images of each layer at a predetermined setting in sequence;
    generating training data-set with at least one curve from preprocessed images in sequence and corresponding build parameters values;
    labeling training data-set with a level of solidification quality based on inspection output; and
    training a machine learning algorithm to generate a predictive model by updating adjusted build parameters values based on the level of solidification quality from inspection output.

6. The method of claim 5, wherein the data source further comprising a job file having two-dimensionally sliced geometric information layer-by-layer, a plurality of captured images in sequence, and build parameters of each layer including laser energy level, heater setting to heat the build plate, gas flow rate, scanning velocity, and predetermined settings of light source and image recording device.

7. The method of claim 5, wherein the machine learning algorithm is trained based on steps of:
    detecting one or more defects from inspection output;
    identifying corresponding layer information, build parameters information, and preprocessed image information from training data-set;
    labeling a level of solidification quality to corresponding data-set, and generating an updated label with adjusted build parameters.

8. The method of claim 1, wherein the build parameters value to be updated through the predictive model comprises a laser energy intensity and/or a scanning velocity.

9. The method of claim 1, wherein the preprocessing of images is performed through one or more computer-vision based systems.

10. The method of claim 1, wherein the preprocessed captured images having contrasts in white and black due to a difference of light reflectivity from a solidified surface of the part under a specific angle of a light source.

11. The method of claim 1, the machine learning algorithm further comprises deep learning algorithm using a convolutional neural network (CNN, or ConvNet).

12. A system for detecting a defect and identifying a corrective action for the defect in real-time during additive manufacturing process, the system comprising:
    a build station having a build platform moving down along the z-axis to keep the top surface of a powder bed stationary during a build process, a build plate arranged on the build platform configured to fix one or more parts and layers of powders, a powder delivery apparatus having a pair of blades configured to store powders and to apply a powder layer onto the build plate, wherein the powder delivery apparatus receives powders from a hopper and moves along a p-axis within the build station; one or more laser sources configured to generate laser energy to melt and solidify one or more parts on a powder layer; a scanner having one or more mirrors configured to control the laser path by adjusting angular orientation of the mirrors and to irradiate the laser onto the geometric coordinates of the target area to melt the powder, an objective lens configured to focus the laser energy at a focal point used in conjunction with a galvanometer, beam expander, a plurality of light sources to illuminate the target area; and a plurality of image recording devices to capture the target area;

a controller coupled to the build station including a memory, a processor, an input/output connector, a storage, and a network interface configured to:

store a job file having geometric information and build parameters information;

receive a plurality of captured images from coupled at least one image recording devices;

conduct image processing to extract feature-set from the captured images;

generate at least one curve from the extracted feature-set;

generate a training data-set from the extracted feature-set and the curves; and train a machine learning algorithm to generate a predictive model configured to apply the at least one curve to calculate a level of solidification quality, wherein the predictive model is trained based on training data-set and updated build parameters values based on a level of solidification quality from inspection output; and an external server coupled to the controller configured to distribute electronic ledger for tracking manufacturing process information associated with the build process.

13. The system of claim 12, wherein the controller is adjusting build parameters through coupled external devices.

14. A method for detecting a defect and identifying a corrective action for the defect in real-time using a plurality of validation coupons during additive manufacturing process, the method comprising:

loading a job file from a processor;

applying a powder layer on a build plate using a powder delivery apparatus;

perform a first defect detecting process of a target area of the applied powder layer, wherein the first defect detecting process further comprises steps of illuminating the target area using at least one light source at predetermined setting in sequence, capturing one or more images on the target area using at least one image recording device at predetermined setting in sequence, performing preprocessing of received images using one or more computer-vision systems, identifying any defect of the applied powder layer, giving an alert to correct an issue if a corrective action is determined to perform, and performing corrective actions thereof;

scan the powder layer using one or more laser sources to fabricate a desired part with a plurality of validation coupons at predefined build parameters;

perform a second defect detecting process of the target area, wherein the second defect detecting process further comprises steps of illuminating the target area using at least one light source at predetermined setting in sequence, capturing one or more reference images on the target area using at least one image recording device at predetermined setting in sequence, performing preprocessing of received reference images using one or more computer-vision systems to extract feature-set, generating at least one curve from the extracted feature-set, generating a training data-set from the extracted feature-set and the curves, identifying a level of solidification quality by applying the curve to a predictive model, wherein the predictive model is trained based on training data-set and updated build parameters values based on a level of solidification quality from inspection output, update build parameters according to the level of solidification quality if an adjustment of build parameter is determined to perform, and adjust the build parameters via a coupled controller; and perform a third defect detecting process of the target area, wherein the third defect detecting process further comprises steps of illuminating the target area using at least one light source at predetermined setting in sequence, capturing one or more reference images on a predefined region using at least one image recording device at predetermined setting in sequence, performing preprocessing of received coupon images using one or more computer-vision systems to extract feature-set, generating at least one curve from the extracted feature-set, generating a training data-set from the extracted feature-set and the curves, identifying a level of solidification quality by applying the curve to a predictive model, wherein the predictive model is trained based on training data-set and updated build parameters values based on a level of solidification quality from inspection output, update build parameters according to the level of solidification quality if an adjustment of build parameter is determined to perform, and adjust the build parameters via the coupled controller.

15. The method of claim 14, the method further selectively performs the second defect detecting process or the third defect detecting process during the manufacturing process.

16. The method of claim 14, wherein the detected defects from the first defect detecting process are a short feeding including uneven surface of a powder layer and/or a patterned feeding.

17. The method of claim 14, wherein the alert configured to correct issues associated with the first defect detecting process comprising:

replacing a blade;

dispensing powders; and/or stopping the process.

18. The method of claim 14, wherein the computer-vision system is performing pattern matching and/or color contrast analysis using a predetermined tolerance value associated with the image analysis.

* * * * *